United States Patent

(12) United States Patent
Saeki

(10) Patent No.: US 9,042,179 B2
(45) Date of Patent: May 26, 2015

(54) METHOD FOR WRITING IN AND READING DATA FROM A SEMICONDUCTOR STORAGE DEVICE AND SEMICONDUCTOR STORAGE DEVICE

(75) Inventor: Katsutoshi Saeki, Miyagi (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 208 days.

(21) Appl. No.: 13/324,559

(22) Filed: Dec. 13, 2011

(65) Prior Publication Data
US 2012/0163089 A1 Jun. 28, 2012

(30) Foreign Application Priority Data
Dec. 28, 2010 (JP) ................................ 2010-292451

(51) Int. Cl.
G11C 16/04 (2006.01)
G11C 16/34 (2006.01)
G11C 16/14 (2006.01)
G11C 7/06 (2006.01)

(52) U.S. Cl.
CPC ............ G11C 16/0466 (2013.01); G11C 16/34 (2013.01); G11C 16/04 (2013.01); G11C 7/062 (2013.01); G11C 16/0483 (2013.01); G11C 16/14 (2013.01)

(58) Field of Classification Search
CPC .... G11C 16/26; G11C 16/28; G11C 11/5642; G11C 2211/5634; G11C 16/34; G11C 16/04; G11C 7/062
USPC .................. 365/184, 185.03, 185.18, 185.28, 365/185.29, 185.22, 185.09, 185.04, 365/185.11, 200, 201, 189.15
See application file for complete search history.

(56) References Cited

U.S. PATENT DOCUMENTS

| 6,188,603 | B1* | 2/2001 | Takeda ..................... 365/185.09 |
| 7,468,914 | B2* | 12/2008 | Toda .......................... 365/185.2 |
| 7,933,153 | B2* | 4/2011 | Furnemont ............. 365/185.18 |
| 8,223,540 | B2* | 7/2012 | Wu ........................... 365/185.03 |

(Continued)

FOREIGN PATENT DOCUMENTS

| JP | 2005-064295 A | 3/2005 |
| JP | 2006-065995 A | 3/2006 |

(Continued)

OTHER PUBLICATIONS

Full machine translated Japanese patent No. JP_2005-06295 cited by the applicant in IDS. Attached file "Machine_Translated_IDS_Ref_JP_2005-06295".*

(Continued)

*Primary Examiner* — Richard Elms
*Assistant Examiner* — Ajay Ojha
(74) *Attorney, Agent, or Firm* — Studebaker & Brackett PC

(57) ABSTRACT

A method for writing data in a semiconductor storage device and a semiconductor storage device are provided, that can reduce variations in readout current from a sub storage region which serves as a reference cell for the memory cells of the semiconductor storage device, thereby preventing an improper determination from being made when determining the readout current from a memory cell. In the method, data is written on a memory cell in two data write steps by applying voltages to the first and second impurity regions of the memory cell, the voltages being different in magnitude from each other.

13 Claims, 7 Drawing Sheets

(56) References Cited

U.S. PATENT DOCUMENTS

| | | |
|---|---|---|
| 2006/0044886 A1 | 3/2006 | Iwata et al. |
| 2007/0025147 A1 | 2/2007 | Mori |
| 2007/0086255 A1* | 4/2007 | Lin et al. ............... 365/210 |
| 2007/0183193 A1 | 8/2007 | Yano et al. |

FOREIGN PATENT DOCUMENTS

| | | |
|---|---|---|
| JP | 2007-035179 A | 2/2007 |
| WO | 2007/069321 A1 | 6/2007 |

OTHER PUBLICATIONS

An Office Action; "Notice of Rejection," issued by the Japanese Patent Office on Jun. 17, 2014, which corresponds to Japanese Patent Application No. 2010-292451 and is related to U.S. Appl. No. 13/324,559; with English language translation.

An Office Action; "Notice of Rejection," issued by the Japanese Patent Office on Jan. 20, 2015, which corresponds to Japanese Patent Application No. 2010-292451 and is related to U.S. Appl. No. 13/324,559; with English language translation.

* cited by examiner

METHOD FOR WRITING IN AND READING DATA FROM A SEMICONDUCTOR STORAGE DEVICE AND SEMICONDUCTOR STORAGE DEVICE

BACKGROUND OF THE INVENTION

1. Field of the Invention

The present invention relates to a method for writing reference data in a sub storage region of a semiconductor storage device and to a semiconductor storage device which has the reference data written therein.

2. Description of the Related Art

Memory devices used for various types of electronic devices for handling digital information can be largely classified into a group of storage devices such as hard disk drives, DVDs, and CDs, which require physical operations; and another group of storage devices equipped with a semiconductor memory device which requires no physical operations. The semiconductor memory device can be further classified into two types according to the method of sustaining stored data. More specifically, the semiconductor memory device can be classified into a volatile semiconductor memory device in which stored information will vanish when the power supply is turned off and a nonvolatile memory device which can sustain the stored information even when the power supply is turned off.

The nonvolatile memory device has one charge accumulation portion for one memory cell and sustains stored information in a manner such that the status in which no charge is accumulated in the charge accumulation portion or an amount of charge less than a predetermined amount is accumulated therein (the not-stored status) is defined as "1", whereas the status in which an amount of charge equal to or greater than the predetermined amount is accumulated in the charge accumulation portion (the stored status) is defined as "0". Some of those memory cells have, for example, an n-type MOSFET (Metal Oxide Semiconductor Field Effect Transistor) structure, in which a FG (Floating Gate) of polycrystalline silicon that is electrically isolated from the other portions is buried in a gate oxide film of the MOSFET. Furthermore, some other memory cells have an n-type MOSFET structure, in which the gate insulating film of the MOSFET is constructed such that a nitride film is sandwiched between oxide films (i.e., an oxide film, a nitride film, and an oxide film are sequentially deposited). In particular, such a structure is referred to as the MONOS (Metal Oxide Nitride Oxide Silicon) structure or SONOS (Silicon Oxide Nitride Oxide Silicon) structure. The floating gate and the nitride film correspond to the charge accumulation portion. Now, by taking the memory cell of the MONOS structure as an example, a description will be made to data write, readout, and erase operations on such a memory cell. Note that in the data write, readout, and erase operations below, the drain (drain terminal and drain region) and the source (source terminal and source region) are defined such that the drain and the source that are determined when stored data is read are also defined as the drain and source even for the write and erase operations. That is, in the data write, readout, and erase operations, the drain and the source that are determined when stored data is read remain the same all the time, and thus the drain and the source are not to be interchangeably defined for the data write and erase operations.

To write data "0" in the nitride film, a positive voltage is applied to the source terminal and the gate terminal with the drain terminal at the ground voltage. This allows electrons travelling from the drain region to the source region through the channel to gain high kinetic energy in the vicinity of the source region and be turned to hot electrons, so that the positive voltage applied to the gate causes the hot electrons to be raised to immediately below the gate terminal, and the raised electrons are sustained in the nitride film. The amount of hot electrons that is equal to or greater than a predetermined amount is sustained in the nitride film, thereby allowing data "0" to be written.

To read the data stored in the nitride film, a positive voltage is applied to the drain terminal and the gate terminal with the source terminal at the ground voltage. At this time, when no charge is accumulated in the nitride film or an amount of charge less than a predetermined amount is accumulated therein (i.e., data "1" is stored in the nitride film), a comparatively large readout current is obtained. On the other hand, when an amount of charge equal to or greater than a predetermined amount is accumulated in the nitride film (i.e., data "0" is stored in the nitride film), the readout current is reduced due to the charge accumulated therein when compared with the status in which data "1" is stored. As such, since the magnitude of the readout current differs depending on the amount of charge in the nitride film, it is possible to read data by determining the magnitude of the readout current. As a detailed method for determining the magnitude of readout current, data is written in advance in a predetermined memory cell of a nonvolatile memory device so that an intermediate amount of charge (i.e., the predetermined amount that is mentioned above) is accumulated therein, the intermediate amount of charge taking on an intermediate value between the amount of charge accumulated in the nitride film of the memory cell in which data "1" is stored and the amount of charge accumulated in the nitride film of the memory cell in which data "0" is stored. Then, the current flowing through the memory cell in which data has been written in advance (hereinafter, also referred to as the sub storage region or the reference cell) is compared with the current flowing through another memory cell (i.e., a memory cell to be read (hereinafter, also referred to as the main storage region)). If the current flowing through the another memory cell is greater than the current flowing through the reference cell, it is determined that data "0" is stored in the another memory cell. If the current flowing through the another memory cell is less than the current flowing through the reference cell, it is determined that data "1" is stored in the another memory cell.

To erase the data stored in the nitride film, a positive voltage is applied to the source terminal and the ground voltage or a negative voltage is applied to the gate terminal with the drain terminal opened. This allows hot holes occurring in the vicinity of the source region to be injected into the nitride film to neutralize the charge accumulated in the nitride film, thereby erasing the data.

Disclosed in Japanese Patent Kokai No. 2005-64295 (Patent Literature 1) is a memory cell in which the charge accumulation portion formed of a nitride film being sandwiched between oxide films is disposed on the drain terminal side and the source terminal side of the gate electrode.

CITATION LIST

Patent Literature

[Patent Literature 1] Japanese Patent Kokai No. 2005-64295

SUMMARY OF THE INVENTION

In the memory cell of the MONOS structure, the aforementioned method may be used to accumulate the predetermined amount of charge in the reference cell. However, the charge is accumulated in the source terminal side of the nitride film whereas no charge is accumulated in the drain terminal side of the nitride film. Accordingly, charge may be accumulated in the drain terminal side of the nitride film due to an electric field stress during a readout operation on the reference cell, or charge may also be accumulated in the drain terminal side of the nitride film in the reference cell by a write operation on another memory cell. As such, a variation in the amount of charge accumulated in the nitride film of the reference cell causes the readout current from the reference cell to be initially reduced, resulting in an improper determination being made when the readout currents are compared between the memory cell being read and the reference cell. Such an improper determination may also be made even in the case of the memory cell disclosed in Document 1 cited above.

The present invention has been developed in view of such problems. It is therefore an object of the invention to provide a method for writing data in a semiconductor storage device and a semiconductor storage device which can reduce a variation in the readout current from a sub storage region serving as a reference cell of memory cells of the semiconductor storage device, thereby preventing an improper determination from being made about the readout current from a memory cell.

To address the aforementioned problems, a method for writing data in a semiconductor storage device is provided. The semiconductor storage device includes a main storage region and a sub storage region having reference data stored therein to determine main data of the main storage region within a plurality of memory cells, wherein each memory cell includes: a gate electrode on a semiconductor substrate which has a first impurity region and a second impurity region with a channel region interposed therebetween; a first charge accumulation portion between the first impurity region and the gate electrode; and a second charge accumulation portion between the second impurity region and the gate electrode. The reference data is written into the sub storage region, and the method includes a first write step of accumulating charge in the first charge accumulation portion by applying a positive voltage to the first impurity region and the gate electrode and applying a voltage lower than the positive voltage to the second impurity region; and a second write step of accumulating charge in the second charge accumulation portion by applying a positive voltage to the second impurity region and the gate electrode and applying a voltage lower than the positive voltage to the first impurity region.

Furthermore, to address the aforementioned problems, the present invention provides a semiconductor storage device which includes a main storage region and a sub storage region having reference data stored therein to determine main data in the main storage region among a plurality of memory cells, each memory cell including: a gate electrode on a semiconductor substrate which has a first impurity region and a second impurity region with a channel region interposed therebetween; a first charge accumulation portion between the first impurity region and the gate electrode; and a second charge accumulation portion between the second impurity region and the gate electrode. The semiconductor storage device is characterized in that charge is accumulated in each of the first charge accumulation portion and the second charge accumulation portion of the sub storage region.

According to the method for writing data in the semiconductor storage device of the present invention, data is written into a memory cell in the two data write steps in which the magnitudes of the voltages applied to the first impurity region and the second impurity region of a memory cell are different from each other. Thus, the semiconductor storage device and the method for writing data in the semiconductor storage device are provided which allow charge to be accumulated in the first charge accumulation portion and the second charge accumulation portion to reduce variations in readout current from the memory cells of the semiconductor storage device, thereby preventing an improper determination from being made when determining the readout current from the memory cells.

DETAILED DESCRIPTION OF THE PREFERRED EMBODIMENTS

Now, the present invention will be described below in more detail with reference to the accompanying drawings in accordance with the embodiments.

Embodiments

Figure 1:
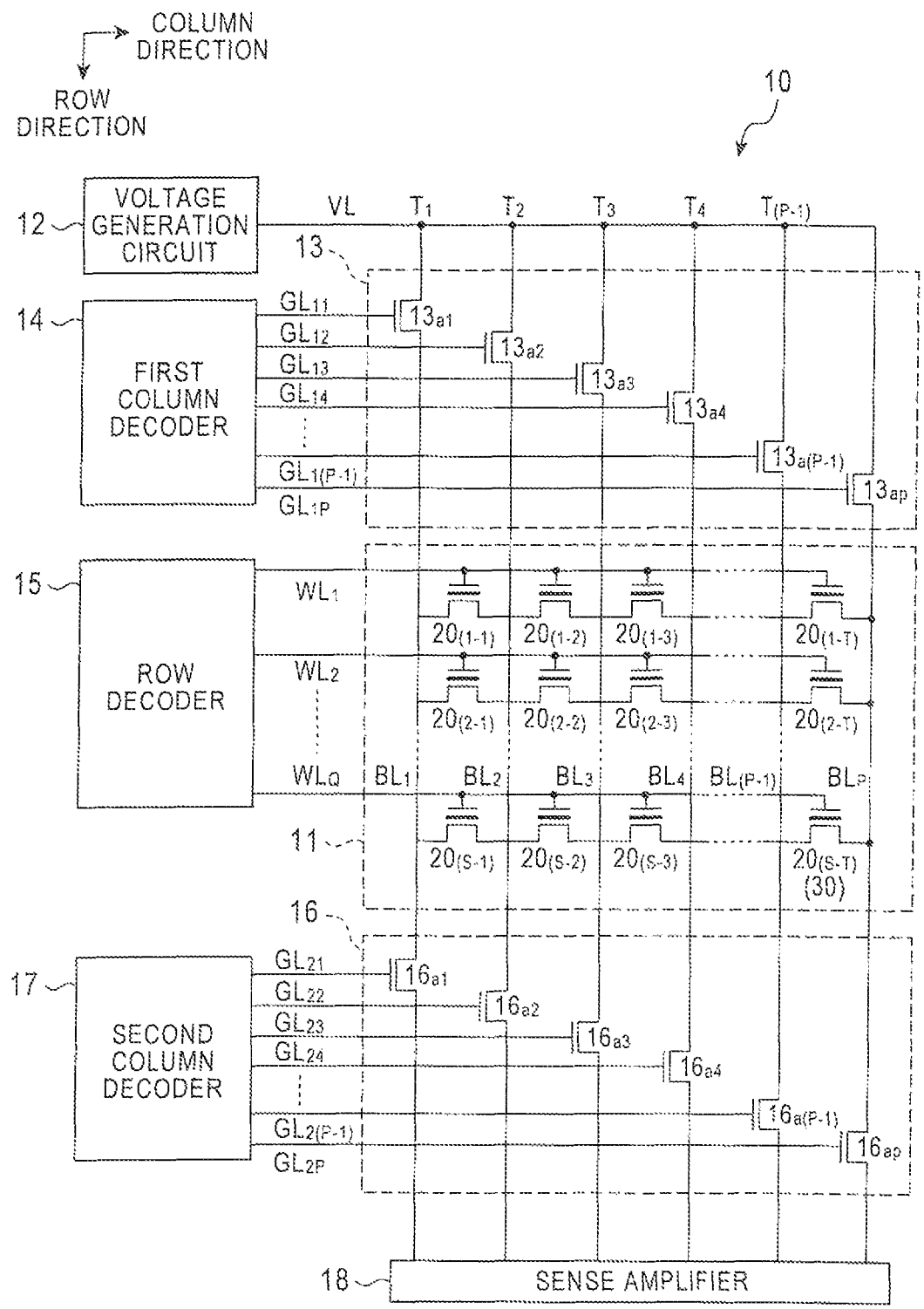
FIG. 1 is a view illustrating the general configuration of a semiconductor storage device according to an embodiment.

First, referring to FIG. 1, a description will be made to a semiconductor storage device according to an embodiment. FIG. 1 is a view illustrating the general configuration of a semiconductor storage device according to the present embodiment.

As shown in FIG. 1, a semiconductor storage device 10 includes a memory array 11 made up of a plurality of memory cells; a voltage generation circuit 12 for generating a voltage to be supplied to the memory array 11; a first group of switching elements 13 provided between the memory array 11 and the voltage generation circuit 12; a first column decoder 14 for supplying a driving signal to the first group of switching elements 13; a row decoder 15 for supplying a driving signal to the memory array 11; a second group of switching elements 16 connected to the memory array 11; a second column decoder 17 for supplying a driving signal to the second group of switching elements 16; and a sense amplifier 18 connected to the second group of switching elements 16.

The memory array 11 is provided with P bit lines $BL_1$, $BL_2$, ..., and $BL_P$ (P is an integer equal to or greater than one) and Q word lines $WL_1$, $WL_2$, ..., and $WL_Q$ (Q is an integer equal to or greater than one) that are disposed to be orthogonal to the bit lines $BL_1, BL_2, \ldots,$ and $BL_P$. It is herein defined that the bit lines $BL_1, BL_2, \ldots,$ and $BL_P$ are provided in the column direction, whereas the word lines $WL_1, WL_2, \ldots,$ and $WL_Q$ are provided in the row direction. Hereinafter, the bit lines $BL_1, BL_2, \ldots,$ and $BL_P$ may simply be referred to as the bit line BL when no particular one is specified, while the word lines $WL_1, WL_2, \ldots,$ and $WL_Q$ may also simply be referred to as the word line WL when no particular one is specified.

Furthermore, at each point of intersection of the bit line BL and the word line WL, there are disposed (S×T) (S and T are each an integer equal to or greater than one) memory cells $20_{(1-1)}, \ldots, 20_{(S-1)}, 20_{(1-2)}, \ldots, 20_{(S-2)}, \ldots,$ and $20_{(1-T)}, \ldots, 20_{(S-T)}$, each of which has a MONOS (Metal Oxide Nitride Oxide Silicon) structure. Hereinafter, when no particular memory cell is specified, these memory cells may also simply be referred to as the memory cell 20. For example, the memory array 11 is made up of 9 bit lines BL (P=9), 8 word lines WL (Q=8), and 64 memory cells 20 (S×T=8×8). Each of the quantities is adjusted as appropriate depending on the memory capacity of the semiconductor storage device 10 and the number of memory cells 20 into which data is written at the same time.

The gate terminal of each memory cell 20 is connected to the word lines $WL_1, WL_2, \ldots,$ and $WL_Q$, while the source and drain terminals of each memory cell 20 are connected to the bit lines $BL_1, BL_2, \ldots,$ and $BL_P$. In FIG. 1, for example, assuming that each memory cell 20 has the drain terminal in the minus column direction and the source terminal in the plus column direction, the gate terminal of the memory cell $20_{(1-1)}$ is connected to the word line $WL_1$, the drain terminal is connected to the bit line $BL_1$, and the source terminal is connected to the bit line $BL_2$. Note that by supplying a write voltage between bit lines BL, the write voltage is supplied between the drain and the source of each memory cell 20.

It is possible to write two types of data (i.e., binary values), data "0" and data "1", to the memory cell 20. Furthermore, in this first embodiment, predetermined criterion data (reference data) has been written in the memory cell $20_{(S-T)}$ that constitutes the memory array 11. The reference data is employed, when data is read from another memory cell 20, to determine whether the readout data is data "0" or data "1" (i.e., as the data for comparison purposes). Hereinafter, the memory cell $20_{(S-T)}$ may also be referred to as a reference cell 30. That is, the memory cells 20 other than the memory cell $20_{(S-T)}$ are a main storage region, whereas the memory cell $20_{(S-T)}$ is a sub storage region.

Note that only the memory cell $20_{(S-T)}$ is employed as the reference cell in this embodiment; however, a plurality of memory cells 20 may also be employed as reference cells. For example, to store multi-value data in the memory cells 20, a plurality of memory cells 20 that are connected to the same word line WL (i.e., in the column direction) may be employed as reference cells, and the reference cells may be each provided with mutually different pieces of reference data. Alternatively, without being limited to the same word line WL, a plurality of memory cells 20 sandwiched between the same bit lines BL (i.e., connected in the row direction) may also be employed as reference cells.

The row decoder 15 is connected to the memory array 11 via each word line WL. The row decoder 15 selects any one word line WL based on a control signal fed from a control circuit (not shown), and then supplies a gate signal to the selected one word line. For example, to select the word line $WL_1$, the gate signal (a predetermined voltage) is supplied to the gate terminals of the memory cells $20_{(1-1)}, \ldots,$ and $20_{(1-T)}$. Note that in the write operation by the semiconductor storage device 10 of this embodiment, the gate terminal of each memory cell 20 is supplied with a common gate signal irrespective of the value of stored data.

The first group of switching elements 13 is made up of P selector elements $13a_1, 13a_2, \ldots,$ and $13a_p$ having an n-type MOSFET (Metal Oxide Semiconductor Field Effect Transistor) structure. Hereinafter, when no particular one is specified, the selector elements $13a_1, 13a_2, \ldots,$ and $13a_p$ may also simply be referred to as the selector element $13a$. Each selector element $13a$ is connected to the drain terminal or the source terminal of the memory cell 20 via the bit line BL. More specifically, the drain terminal of the selector element $13a_1$ is connected to the respective drain terminals of the memory cells $20_{(1-1)}, 20_{(2-1)}, \ldots,$ and $20_{(S-1)}$ via the bit line $BL_1$. The drain terminal of the selector $13a_2$ is connected to the respective source terminals of the memory cells $20_{(1-2)}, 20_{(2-2)}, \ldots,$ and $20_{(S-2)}$ and the respective drain terminals of the memory cells $20_{(1-3)}, 20_{(2-3)},$ and $20_{(S-3)}$ via the bit line $BL_2$.

Furthermore, the respective source terminal of the selector element $13a$ is connected to the voltage generation circuit 12 via connection points $T_1, T_2, \ldots,$ and $T_3$ and a voltage supply line VL. Furthermore, the respective gate terminal of the selector element $13a$ is connected to the first column decoder 14 via the gate signal supply lines $GL_{11}, GL_{12}, \ldots,$ and $GL_{1P}$. Hereafter, when no particular one is specified, the gate signal supply lines $GL_{11}, GL_{12}, \ldots,$ and $GL_{1P}$, may also simply be referred to as the gate signal supply line $GL_1$.

The first column decoder 14 selects any one gate signal supply line $GL_1$ based on a control signal fed from a control circuit (not shown), and then supplies a gate signal to the selected one gate signal supply line. The gate signal supplied to the selected one gate signal supply line $GL_1$ causes a predetermined voltage fed from the voltage generation circuit 12 to be applied to the bit line BL that is connected to the selector element $13a$ coupled to the selected one gate signal supply line $GL_1$. Then, the predetermined voltage is supplied (applied) to the drain terminal or the source terminal of the memory cell 20 connected to the bit line BL. More specifically, selecting the gate signal supply line $GL_{11}$ turns on the selector element $13a_1$, causing the predetermined voltage to be applied to the drain terminal of the memory cells $20_{(1-1)}, 20_{(2-1)}, \ldots,$ and $20_{(S-1)}$ via the bit line $BL_1$.

The second group of switching elements 16 is made up of P selector elements $16a_1, 16a_2, \ldots,$ and $16a_p$ which have an n-type MOSFET structure. Hereinafter, when no particular one is specified, the selector elements $16a_1, 16a_2, \ldots,$ and $16a_p$ may also simply be referred to as the selector element $16a$. Each selector element $16a$ is connected to the drain terminal or the source terminal of the memory cell 20 via the bit line BL. More specifically, the source terminal of the selector element $16a_1$ is connected to the respective drain terminals of the memory cells $20_{(1-1)}, 20_{(2-1)}, \ldots,$ and $20_{(S-1)}$ via the bit line $BL_1$. Furthermore, the source terminal of the selector element $16a_2$ is connected to the respective source terminals of the memory cells $20_{(1-2)}, 20_{(2-2)}, \ldots,$ and $20_{(S-2)}$ and the respective drain terminals of the memory cells $20_{(1-3)}, 20_{(2-3)}, \ldots,$ and $20_{(S-3)}$ via the bit line $BL_2$.

Furthermore, the respective drain terminal of the selector element $16a$ is connected to the sense amplifier 18. Furthermore, the respective gate terminal of the selector element $16a$ is connected to the second column decoder 17 via the gate signal supply lines $GL_{21}, GL_{22}, \ldots,$ and $GL_{2P}$. Hereinafter, when no particular one is specified, the gate signal supply lines $GL_{21}, GL_{22}, \ldots,$ and $GL_{2P}$ may also simply be referred to as the gate signal supply line $GL_2$.

The second column decoder 17 selects any one gate signal supply line GL2 based on a control signal fed from a control circuit (not shown), and then supplies a gate signal to the selected one gate signal supply line. Here, since the sense amplifier 18 is connected to the earth potential (ground potential), supplying the gate signal to the selected one gate signal supply line $GL_2$ causes the bit line BL connected to the selector element 13a coupled to the selected one gate signal supply line $GL_1$ to have the ground potential. Then, the drain terminal or the source terminal of the memory cell 20 connected to the bit line BL has the ground potential. More specifically, selecting the gate signal supply line $GL_{21}$ turns on the selector element $16a_1$, causing the drain terminal of the memory cells $20_{(1-1)}$, $20_{(2-1)}$, . . . , and $20_{(S-1)}$ to have the ground potential via the bit line $BL_1$.

The sense amplifier 18 is connected to the drain terminal of the selector element 16a. During a readout operation, the sense amplifier 18 is supplied with a readout current which occurs depending on the status of the memory cell 20 selected by the first column decoder 14, the row decoder 15, and the second column decoder 17. At this time, the sense amplifier 18 is also supplied with a reference readout current from the reference cell 30 selected by the first column decoder 14, the row decoder 15, and the second column decoder 17. Then, the sense amplifier compares the magnitudes of the two readout currents to determine the data stored in the memory cell 20. More specifically, the sense amplifier 18 determines the data stored in the memory cell 20 to be "1" when the current fed from the reference cell is greater than the current from the memory cell 20 being read, whereas the data stored in the memory cell 20 is determined to be "0" when the current fed from the reference cell is less than the current from the memory cell 20 being read.

Figure 2:
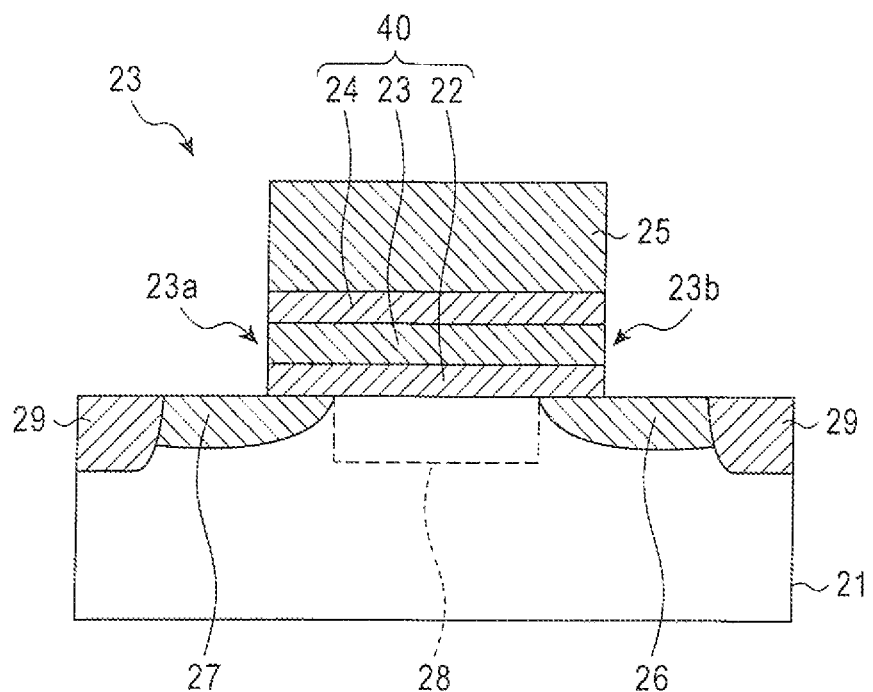
FIG. 2 is a cross-sectional view illustrating a memory cell that constitutes a semiconductor storage device according to an embodiment.

Now, referring to FIG. 2, a description will be made to the structure of the memory cell 20 that constitutes the semiconductor storage device 10 and to the principle for writing, reading, and erasing data in the memory cell 20. FIG. 2 is a cross-sectional view illustrating the memory cell 20 that constitutes the semiconductor storage device 10 according to this embodiment.

As shown in FIG. 2, the memory cell 20 is constructed such that a tunnel oxide film 22 of $SiO_2$, a charge accumulation film 23 of SiN, an insulating film 24 of $SiO_2$, and a gate electrode 25 of silicon are stacked in layers on top of a p-type silicon substrate 21. There are formed a first impurity region 26 and a second impurity region 27, which contain an n-type impurity at a high concentration, so as to sandwich the tunnel oxide film 22 on the surface of the silicon substrate 21. The surface region of the silicon substrate 21 immediately below the tunnel oxide film 22 is a channel region 28 through which a current flow path is formed during the operation of the n-type MOSFET. There is also provided an element separating oxidation layer 29 inside the silicon substrate 21 to surround the first impurity region 26, the second impurity region 27, and the channel region 28. Note that the reference cell 30 also has the same structure as that of the aforementioned memory cell 20.

Furthermore, the tunnel oxide film 22, the charge accumulation film 23, and the insulating film 24 constitute a charge accumulation structure 40. Furthermore, one end portion of the charge accumulation film 23 which is located above the second impurity region 27 will be referred to as a first charge accumulation portion 23a, while the other end portion of the charge accumulation film 23 which is located above the first impurity region 26 will be referred to as a second charge accumulation portion 23b.

Now, a description will be made to the data write, readout, and erase operations on the memory cell 20 that is constructed as mentioned above. Here, concerning the drain (the drain terminal and the drain region) and the source (the source terminal and the source region) in the data write, readout, and erase operations below, the drain and the source that are determined when stored data is read are also defined as the drain and the source in the write and erase operations. That is, the drain and the source that are determined when stored data is read in the data write, readout, and erase operations are invariable all the time, and thus the drain and the source are not to be interchangeably defined for the data write and erase operations. Note that in this embodiment, the first impurity region 26 is defined as the drain region and the second impurity region as the source region.

First, to write data into the memory cell 20, a positive voltage (for example, +5 V) is applied to the gate electrode 25, and a positive voltage (for example, +5 V) is also applied to the source region or the second impurity region 27, with the drain region or the first impurity region 26 and the silicon substrate 21 at the ground potential (0 V). This causes electrons travelling through the channel region 28 from the first impurity region 26 toward the second impurity region 27 to acquire high kinetic energy in the vicinity of the second impurity region 27 and thus be turned to hot electrons. Then, the high voltage being applied to the gate electrode 25 causes some of the hot electrons to jump over the tunnel oxide film 22 and then be raised to the charge accumulation film 23 (i.e., the hot electrons are accumulated in the charge accumulation film 23). Here, the hot electrons raised to the charge accumulation film 23 are accumulated in the second impurity region 27 side portion of the charge accumulation film 23 (i.e., in the first charge accumulation portion 23a) and not accumulated in the first impurity region 26 side portion (i.e., in the second charge accumulation portion 23b). That is, the hot electrons are accumulated in the source region side portion of the charge accumulation film 23 and not accumulated in the drain region side portion. Note that with data "0" stored in the memory cell 20, the amount of charge accumulated in the first charge accumulation portion 23a is equal to or greater than a predetermined amount, while with data "1" stored in the memory cell 20, the amount of charge accumulated in the first charge accumulation portion 23a is less than the predetermined value. Note that a method for writing data into the reference cell 30 is different from the aforementioned method, and thus will be described later.

Now, to read the data stored in the memory cell 20, a positive voltage (for example, +3 V) is applied to the gate electrode 25 and a positive voltage (for example, +1.5 V) or a readout voltage is applied to the drain region, i.e., the first impurity region 26, with the source region or the second impurity region 27 and the silicon substrate 21 at the ground potential (0 V). This causes a readout current to flow from the first impurity region 26 toward the second impurity region 27. The magnitude of the readout current varies depending on the amount of charge accumulated in the first charge accumulation portion 23a. That is, the greater the amount of charge accumulated in the first charge accumulation portion 23a, the lower the readout current becomes. Furthermore, the same readout method is applied to the reference cell 30 to read the readout current depending on the amount of charge accumulated in the reference cell 30. Then, the sense amplifier 18 compares the readout current fed from the memory cell 20 being read with the readout current fed from the reference cell 30, thereby determining which data, "0" or "1", is stored in the memory cell 20 being read.

Next, to erase the data stored in the memory cell 20, a positive voltage (for example, +5 V) is applied to the second impurity region 27 serving as the source region and a negative voltage (for example, −5 V) or 0 V is applied to the gate electrode 25, with the drain region or the first impurity region 26 and the silicon substrate 21 at the ground potential (0 V). This allows hot holes occurring in the vicinity of the second impurity region 27 to be injected into the charge accumulation film 23. As a result, the charge (electrons) sustained in the first charge accumulation portion 23a can be neutralized, thus erasing the data.

Note that to accumulate charge on the first impurity region 26 side of the charge accumulation film 23, the voltage to be applied to the first impurity region 26 and the voltage to be applied to the second impurity region 27 can be exchanged to do so.

Figure 3:
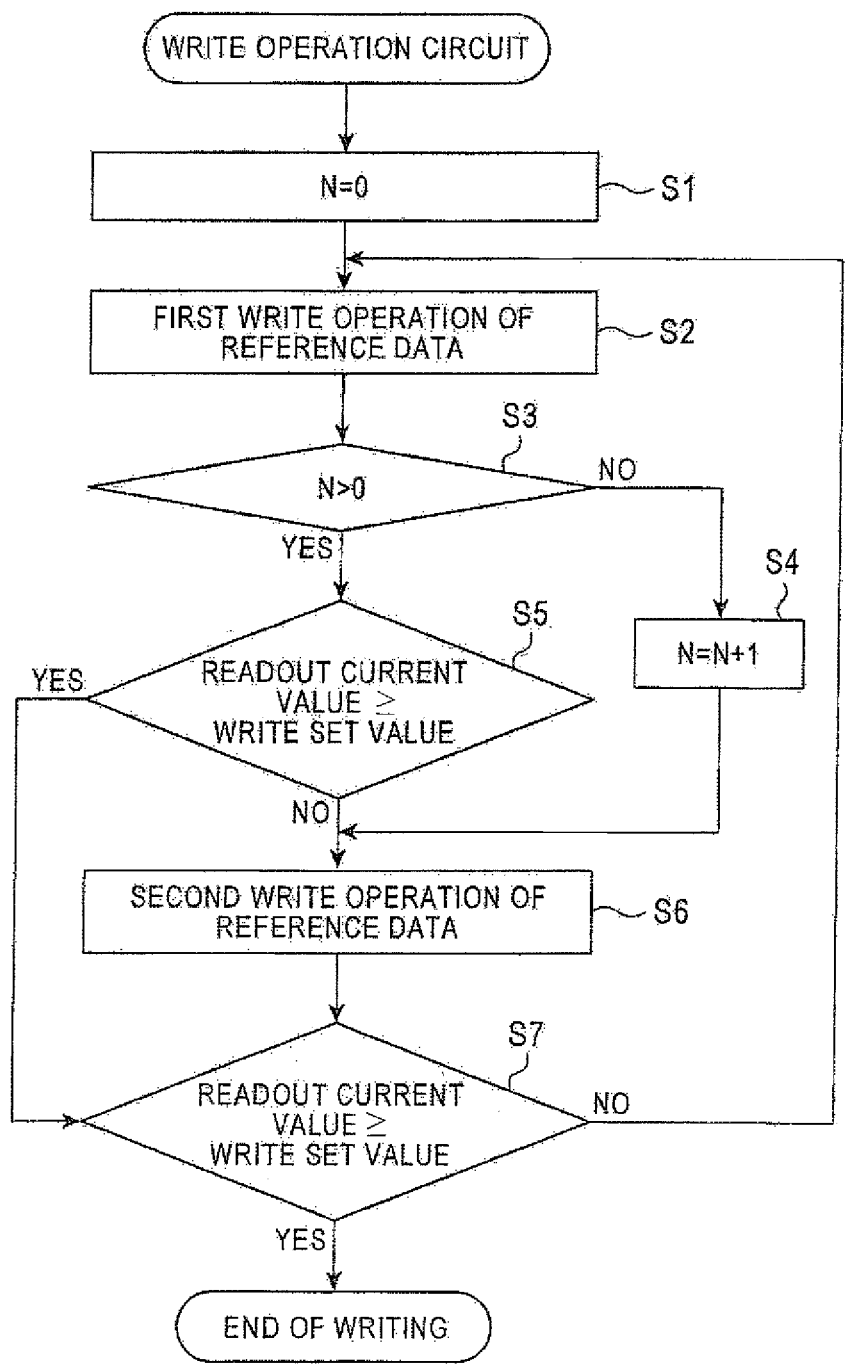
FIG. 3 is a flow diagram showing a method for writing data into a reference cell that constitutes a semiconductor storage device according to an embodiment.
Figure 4A:
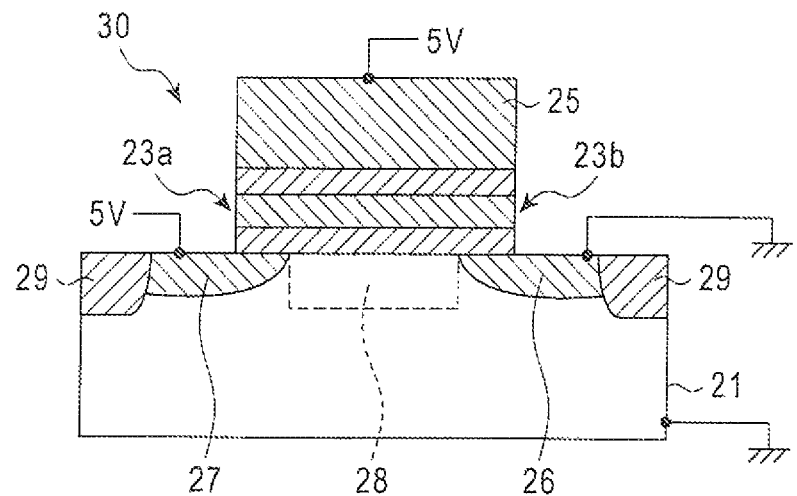
FIGS. 4A, 4B, and 4C are each a cross-sectional view illustrating each step of a method for writing data into a reference cell that constitutes a semiconductor storage device according to an embodiment.
Figure 4B:
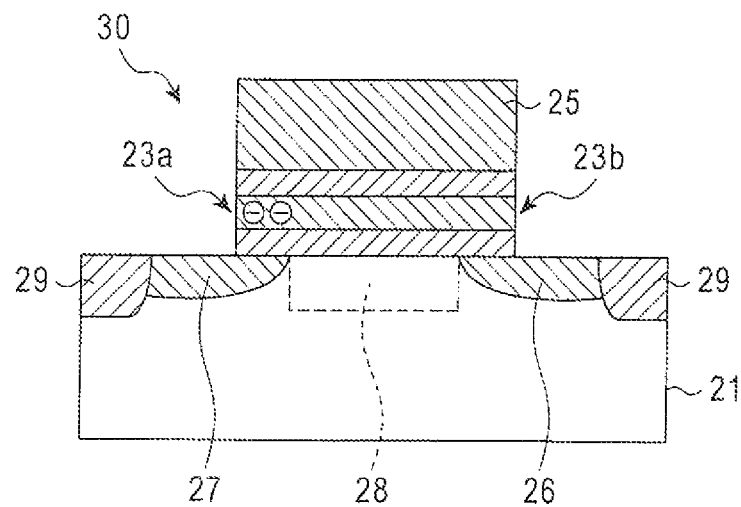
Figure 4C:
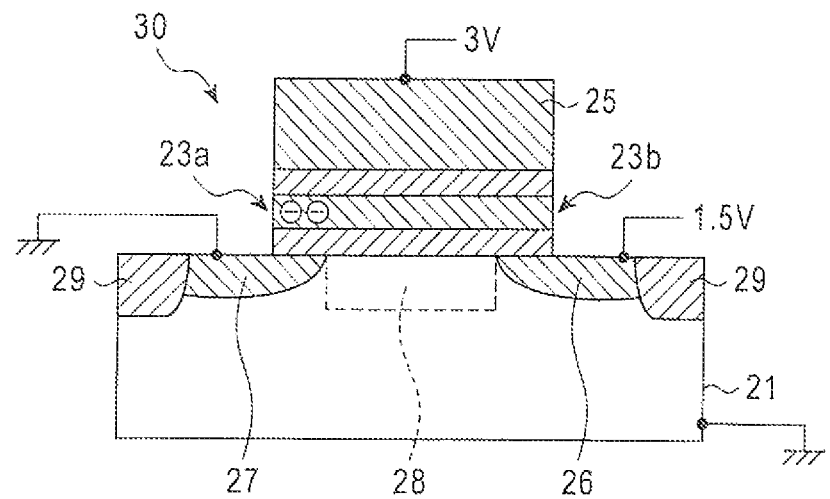

Now, referring to FIGS. 3 and 4A to 4C, a description will be made to a method for writing data into the reference cell in the memory array that constitutes the semiconductor storage device according to this embodiment. FIG. 3 is a flow diagram showing the writing of data into the reference cell in the memory array. Furthermore, FIGS. 4A to 4C are each a cross-sectional view illustrating the writing of data into the reference cell in the memory array.

First, in the status of no data written in the reference cell 30, N=0 (step S1).

Next, a first write operation of the reference data is performed so as to accumulate charge in the second impurity region 27 side portion of the charge accumulation film 23 of the reference cell 30 (i.e., in the first charge accumulation portion 23a) (step S2: a first write step). More specifically, a positive voltage (for example, +5 V) is applied to the gate electrode 25 and a positive voltage (for example, +5 V) is also applied to the second impurity region 27 serving as the source region, with the drain region or the first impurity region 26 and the silicon substrate 21 at the ground potential (0 V) (FIG. 4A). This causes electrons travelling through the channel region 28 from the first impurity region 26 toward the second impurity region 27 to acquire high kinetic energy in the vicinity of the second impurity region 27 and thus be turned to hot electrons. Then, the high voltage being applied to the gate electrode 25 causes some of the hot electrons to jump over the tunnel oxide film 22 and then be raised to the second impurity region 27 side portion of the charge accumulation film 23 (i.e., the first charge accumulation portion 23a) (FIG. 4B). Note that although FIG. 4B is a schematic view showing two electrons accumulated in the first charge accumulation portion 23a, a greater number of electrons are accumulated in practice in the first charge accumulation portion 23a.

Next, the value of N is determined (step S3). If N>0 is not satisfied, then the process proceeds to step S4, whereas if N>0 is satisfied, the process proceeds to step S5. In step S4, 1 is added to the current value of N so that N=1. After step S4 is performed, the process proceeds to step S6. Here, the process proceeds to step S4 when none of the aforementioned first write operation and a second write operation, to be described later, is carried out even once.

Next, in step S3, if N>0 is satisfied (i.e., N=1), the reference data stored in the reference cell 30 is read to determine whether the readout current flowing at the time of the readout is equal to or greater than a predetermined value (the write set value) (step S5). More specifically, a positive voltage (for example, +3 V) is applied to the gate electrode 25 and a positive voltage (for example, +1.5 V) serving as a readout voltage is applied to the drain region or the first impurity region 26, with the source region or the second impurity region 27 and the silicon substrate 21 at the ground potential (0 V) (FIG. 4C). This causes a readout current to flow from the first impurity region 26 toward the second impurity region 27. Here, the write set value is an intermediate current value between the value of a readout current that flows when no charge is accumulated in the memory cell 20 (i.e., when data "1" is stored therein) and the value of a readout current that flows when a large amount of charge is accumulated in the memory cell 20 (i.e., when data "0" is stored therein). Note that the write set value can be adjusted as appropriate so that such the adjustment can change the boundary for distinguishing the status of stored data being "0" from the status of stored data being "1".

Figure 5A:
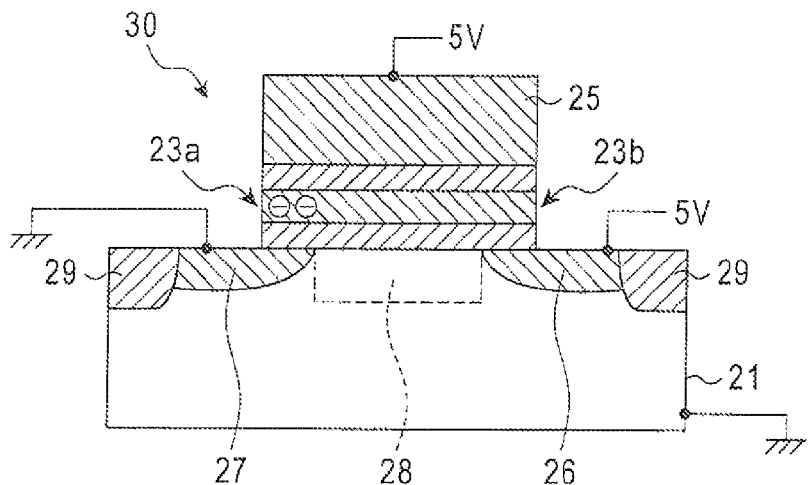
FIGS. 5A, 5B, and 5C are each a cross-sectional view illustrating each step of the method for writing data into a reference cell that constitutes a semiconductor storage device according to an embodiment.
Figure 5B:
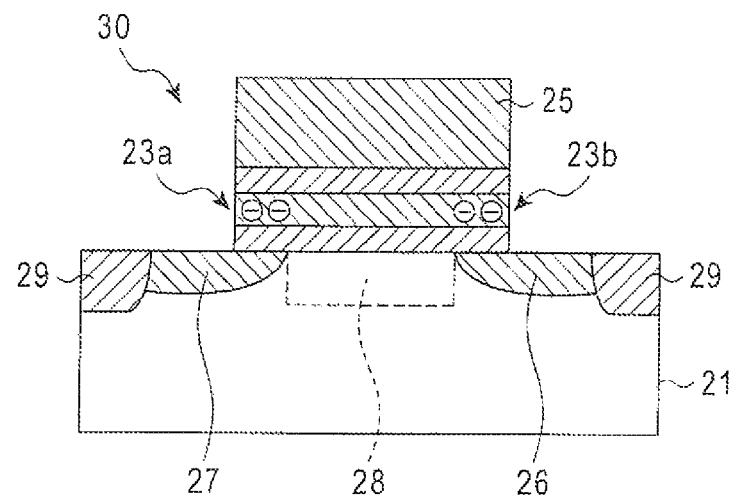

Next, if the readout current flowing after step S4 or when the reference data stored in the reference cell 30 is read is less than the write set value, the second write operation of the reference data is carried out so as to accumulate charge in the first impurity region 26 side portion of the charge accumulation film 23 of the reference cell 30 (i.e., in the second charge accumulation portion 23b) (step S6: a second write step). More specifically, a positive voltage (for example, +5 V) is applied to the gate electrode 25 and a positive voltage (for example, +5 V) is also applied to the drain region or the first impurity region 26, with the source region or the second impurity region 27 and the silicon substrate 21 at the ground potential (0 V) (FIG. 5A). This causes electrons travelling through the channel region 28 from the second impurity region 27 toward the first impurity region 26 to acquire high kinetic energy in the vicinity of the first impurity region 26 and thus be turned to hot electrons. Then, the high voltage being applied to the gate electrode 25 would cause some of the hot electrons to jump over the tunnel oxide film 22 and then be raised to the first impurity region 26 side portion of the charge accumulation film 23 (i.e., the second charge accumulation portion 23b) (FIG. 5B). On the other hand, in step S5, if the readout current flowing when the reference data stored in the reference cell 30 is read is equal to or greater than the write set value, then the write operation of the reference data into the reference cell 30 is ended.

Figure 5C:
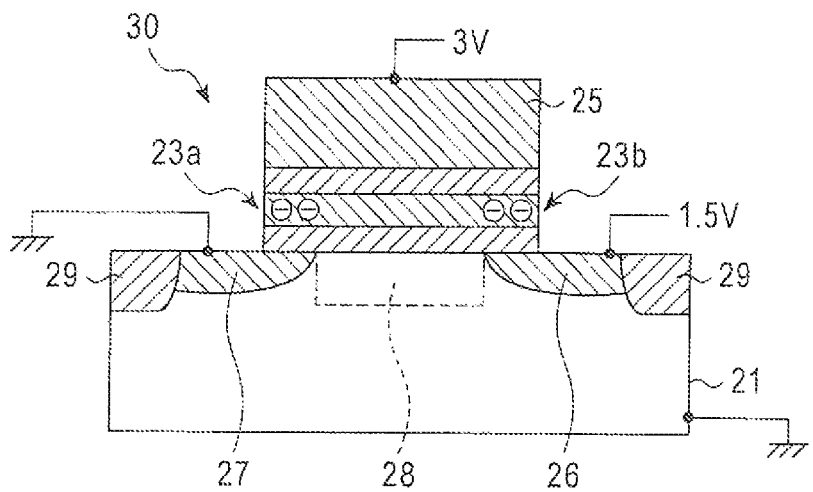

After step S6 is completed, the reference data stored in the reference cell 30 is read again to determine whether the readout current flowing at the time of the readout is equal to or greater than the predetermined value (the write set value) (step S7: a determination step). More specifically, a positive voltage (for example, +3 V) is applied to the gate electrode 25 and a readout voltage or a positive voltage (for example, +1.5 V) is applied to the first impurity region 26, with the second impurity region 27 and the silicon substrate 21 at the ground potential (0 V) (FIG. 5C). This causes a readout current to flow from the first impurity region 26 to the second impurity region 27. In step S7, if the readout current flowing when the reference data stored in the reference cell 30 is read is less than the write set value, the process returns to step S1, where the reference data is written again (i.e., a repetition step of repeatedly executing the first and second write operations is performed) so as to accumulate charge in the second impurity region 27 side portion of the charge accumulation film 23 of the reference cell 30 (i.e., in the first charge accumulation portion 23a). Note that to write the reference data again, the process proceeds from step S3 to step S5 because N=1. That is, to write the reference data again, it is determined after the first write operation whether the readout current value is equal to or greater than the write set value. On the other hand, in step S7, if the readout current flowing when the reference data stored in the reference cell 30 is read is equal to or greater than the write set value, then the write operation of the reference data into the reference cell 30 is ended.

As described above, in the method for writing reference data into the reference cell 30 according to this embodiment, the reference data is written so as to accumulate charge alternately in the first impurity region 26 side portion of the charge accumulation film 23 (i.e., in the second charge accumulation portion 23b) and the second impurity region 27 side portion of the charge accumulation film 23 (i.e., in the first charge accumulation portion 23a). This causes the charge accumulation film 23 to accumulate charge in the first charge accumulation portion 23a and the second charge accumulation portion 23b. When charge is accumulated in one end and the other end (i.e., both ends) of the charge accumulation film 23, the charge accumulated in the charge accumulation film 23 prevents hot electrons from moving toward the gate electrode due to an electric field stress during a readout from the reference cell 30. Furthermore, charge is also prevented from moving into the charge accumulation film 23 of the reference cell 30 due to the write operation on another memory cell 30. Accordingly, no charge is injected into the charge accumulation film 23 of the reference cell 30 by other than the write operation of reference data, thus preventing variations in the readout current from the reference cell 30.

In the aforementioned write flow, the amount of data to be written at a time (i.e., the amount of charge to be accumulated) is preferably reduced so that the reference data that has to be written (i.e., the amount of charge that has to be accumulated) is written at a plurality of times. This allows for averaging the amounts of charge accumulated in the first charge accumulation portion 23a and the second charge accumulation portion 23b, thereby readily preventing variations in the readout current of the reference cell 30. Furthermore, in this embodiment, to efficiently prevent hot electrons from moving toward the gate electrode due to an electric field stress during a readout from the reference cell 30, the amount of charge accumulated in the second charge accumulation portion 23b of the charge accumulation film 23 of the reference cell 30 may be increased when compared with the amount of charge accumulated in the first charge accumulation portion 23a of the charge accumulation film 23 of the reference cell 30. This is because charge tends to move into the second charge accumulation portion 23b of the charge accumulation film 23 during a readout from the reference cell 30 in this embodiment.

Furthermore, by employing the aforementioned method for writing data, the semiconductor storage device 10 can have the reference cell 30 with charge accumulated in both ends of the charge accumulation film 23. Furthermore, by allowing the reference data to be written into the reference cell 30 at a plurality of times, the semiconductor storage device 10 can have the reference cell 30 with an equal amount of charge accumulated on both ends.

Note that if the amount of data to be written in the first and second write steps is determined in advance in the aforementioned flow, the determination step in steps S5 and S7 can be eliminated. Furthermore, the amount of charge accumulated in both ends of the charge accumulation film 23 may be measured after the reference data has been written in the first and second write steps, and then the aforementioned determination may be made (i.e., step S5 can be eliminated from the flow).

Figure 6:
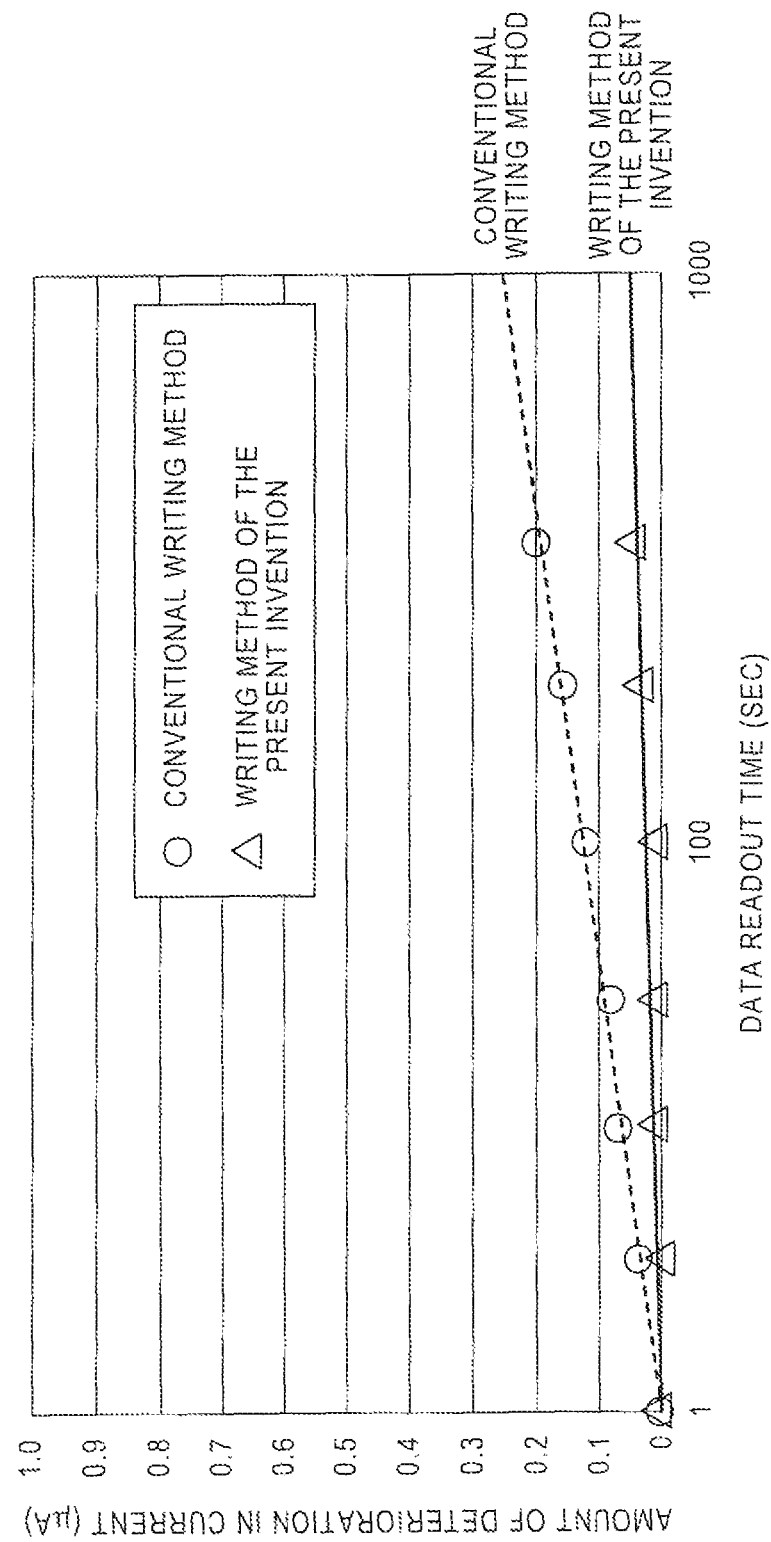
FIG. 6 is a graph for comparing the amounts of deterioration in readout current from a reference cell between a method for writing data into a semiconductor storage device of an embodiment and a method for writing data into a conventional semiconductor storage device.

Next, referring to FIG. 6, a description will be made to the effects of the method of this embodiment for writing reference data into the reference cell 30. To this end, the amounts of deterioration in readout current at the time of reading from the reference cell are compared between the method of this embodiment for writing reference data into the reference cell 30 and a conventional method for writing reference data into the reference cell 30. The horizontal axis of FIG. 6 represents the readout time of the reference data (sec) and the vertical axis represents the amount of deterioration in readout current (μA). Note that the horizontal axis is graduated logarithmically.

As shown in FIG. 6, it was found that at a 100-second readout time for the reference data from the reference cell 30, the data write method according to the embodiment can be used to reduce the amount of deterioration in the readout current from the reference cell to about 10% of that of the conventional method. Furthermore, even when the reference data is read for 1000 seconds, the amount of deterioration in the readout current is estimated to be about 0.5 μA and thus expected to be reduced to about 20% of that of the conventional method.

Figure 7:
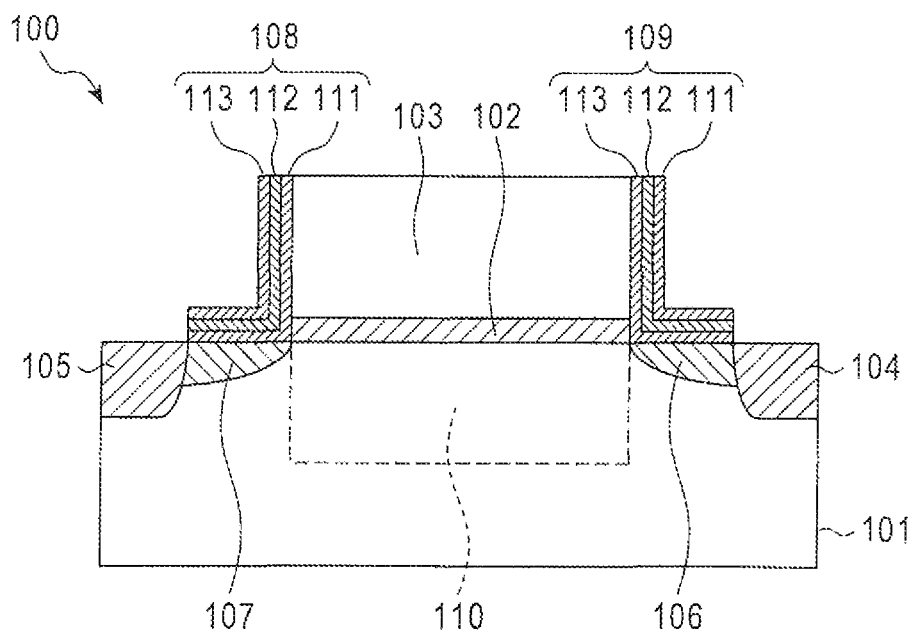
FIG. 7 is a cross-sectional view illustrating another example of a memory cell that constitutes a semiconductor storage device according to an embodiment.

Note that in the aforementioned embodiment, the memory cell 20 has a MONOS structure. However, the invention is not limited thereto. For example, the data write method of the present invention is also applicable even to the structure in which the respective sidewall portions are provided with a charge accumulation portion. Referring to FIG. 7, a description will be made to the structure of a memory cell 100 which has the sidewall structure.

As shown in FIG. 7, the memory cell 100 has such a structure in which a gate electrode 103 of polysilicon is formed on top of a p-type silicon substrate 101 with a gate oxide film 102 of $SiO_2$ disposed therebetween. There are formed a first impurity region 104 and a second impurity region 105, which contain an n-type impurity at a high concentration, so as to sandwich the gate electrode 103 on the surface of the silicon substrate 101. The surface region of the silicon substrate 101 immediately below the gate electrode 103 is a channel region 110 through which a current flow path is formed during the operation of the n-type MOSFET. Between the channel region 110 and the first impurity region 104 and between the channel region 110 and the second impurity region 105, there are formed n-type extension regions 106 and 107, which have an impurity at a relatively low concentration, adjacent to the first impurity region 104 and the second impurity region 105, respectively.

A first charge accumulation portion 108 is provided above the extension region 107 and a second charge accumulation portion 109 is provided above the extension region 106. The first and second charge accumulation portions 108 and 109 are each made up of an ONO layered insulating film which has a silicon oxide film 111, a silicon nitride film 112, and a silicon oxide film 113. The first and second charge accumulation portions 108 and 109 extend along the sidewall of the gate electrode 103 from the extension regions 106 and 107, respectively. This ensures that charge is accumulated and sustained. Furthermore, the first and second charge accumulation portions 108 and 109 are spaced apart from each other, so that charge can be accumulated and sustained separately from and independently of each charge accumulation portion.

This application is based on Japanese Patent Application No. 2010-292451 which is herein incorporated by reference.

What is claimed is:

1. A method for writing in and reading data from a semiconductor storage device, the semiconductor storage device including a plurality of memory cells each including:

a gate electrode on a semiconductor substrate which has a first impurity region and a second impurity region with a channel region interposed therebetween;

a first charge accumulation portion between the first impurity region and the gate electrode; and a second charge accumulation portion between the second impurity region and the gate electrode, the plurality of memory cells being divided into both of a main storage region consisting of a majority of the memory cells for storing main data; and a sub storage region consisting of at least one of the memory cells for storing reference data, the method comprising:

writing, in the first and second charge accumulation portions of each memory cell in the sub storage region, the reference data distinguishing both of a value of a readout current that flows when no charge is accumulated in the main storage region and the value of a readout current that flows when a large amount of charge is accumulated the main storage region, the reference data being stored so as to accumulate charge through both of:

a first write step of accumulating charge in the first charge accumulation portion of each memory cell in the sub storage region by applying a positive voltage to the first impurity region and the gate electrode and applying a voltage lower than the positive voltage to the second impurity region; and a second write step of accumulating charge in the second charge accumulation portion of each memory cell in the sub storage region by applying a positive voltage to the second impurity region and the gate electrode and applying a voltage lower than the positive voltage to the first impurity region, wherein the charge accumulated in the first and second charge accumulation portions prevents electrons from moving towards the gate electrode during a readout of the reference data from the memory cell in the sub storage region; and a step of reading data from the main storage region while comparing a readout current fed from each memory cell in said main storage region with a readout current fed from each memory cell in said sub storage region.

2. The method according to claim 1, comprising:

a determination step of measuring an amount of charge accumulated in the first charge accumulation portion after the first and second write steps to determine whether a measured value of the amount of charge accumulated in the first charge accumulation portion is equal to or greater than a predetermined value, and a repetition step of repeatedly executing the first and second write steps when the measured value of the amount of charge accumulated in the first charge accumulation portion is determined in the determination step to be less than the predetermined value.

3. The method according to claim 2, wherein in the repetition step, the amount of charge accumulated in the first charge accumulation portion after the first write step is measured, and then it is determined whether the measured value of the amount of charge accumulated in the first charge accumulation portion is equal to or greater than the predetermined value, so that when the measured value of the amount of charge accumulated in the first charge accumulation portion is determined to be equal to or greater than the predetermined value, the repetition step is stopped.

4. The method according to claim 1, wherein an amount of charge accumulated in the first write step and an amount of charge accumulated in the second write step are equalized.

5. The method according to claim 2, wherein an amount of charge accumulated in the first write step and an amount of charge accumulated in the second write step are equalized.

6. The method according to claim 3, wherein an amount of charge accumulated in the first write step and an amount of charge accumulated in the second write step are equalized.

7. The method according to claim 1, wherein an amount of charge accumulated in the first write step is less than an amount of charge accumulated in the second write step.

8. The method according to claim 2, wherein an amount of charge accumulated in the first write step is less than an amount of charge accumulated in the second write step.

9. The method according to claim 3, wherein an amount of charge accumulated in the first write step is less than an amount of charge accumulated in the second write step.

10. A semiconductor storage device, comprising:

a plurality of memory cells each including:

a gate electrode on a semiconductor substrate which has a first impurity region and a second impurity region with a channel region interposed therebetween;

a first charge accumulation portion between the first impurity region and the gate electrode; and a second charge accumulation portion between the second impurity region and the gate electrode, the plurality of memory cells being divided into both of a main storage region consisting of a majority of the memory cells for storing main data; and a sub storage region consisting of at least one of the memory cells for storing reference data, the reference data distinguishing both of a value of a readout current that flows when no charge is accumulated in the main storage region and the value of a readout current that flows when a large amount of charge is accumulated the main storage region, the reference data being stored by accumulating charge in the first and second charge accumulation portions of each memory cell in said sub storage region so that the charge accumulated in the first and second charge accumulation portions prevents electrons from moving toward the gate electrode during a readout of the reference data from the memory cell in the sub storage region, and a sense device carrying out reading data from the main storage region while comparing a readout current fed from each memory cell in said main storage region with a readout current fed from each memory cell in said sub storage region.

11. The semiconductor storage device according to claim 10, wherein amounts of charge accumulated in the first charge accumulation portion and the second charge accumulation portion of the sub storage region are equal to each other.

12. A method for writing in and reading data from a semiconductor storage device, the semiconductor storage device including a plurality of memory cells each including:

a gate electrode on a semiconductor substrate which has a first impurity region and a second impurity region with a channel region interposed therebetween;

a first charge accumulation portion between the first impurity region and the gate electrode; and a second charge accumulation portion between the second impurity region and the gate electrode, the plurality of memory cells being divided into both of a main storage region consisting of a majority of the memory cells for storing main data; and a sub storage region consisting of at least one of the memory cells for storing reference data, the method comprising:

writing, in the first and second charge accumulation portions of each memory cell in the sub storage region, the reference data distinguishing both of a value of a readout current that flows when no charge is accumulated in the main storage region and the value of a readout current that flows when a large amount of charge is accumulated the main storage region, the reference data being stored so as to accumulate charge alternately through both of:

a first write step of accumulating charge in the first charge accumulation portion of each memory cell in the sub storage region by applying a positive voltage to the first impurity region and the gate electrode and applying a voltage lower than the positive voltage to the second impurity region; and a second write step of accumulating charge in the second charge accumulation portion of each memory cell in the sub storage region by applying a positive voltage to the second impurity region and the gate electrode and applying a voltage lower than the positive voltage to the first impurity region, wherein an amount of charge accumulation in the second write step is not less than an amount of charge accumulated in the first write step so that the charge accumulated in the first and second charge accumulation portions prevents electrons from moving towards the gate electrode during a readout of the reference data from the memory cell in the sub storage region; and a step of reading data from the main storage region while comparing a readout current fed from each memory cell in said main storage region with a readout current fed from each memory cell in said sub storage region.

13. The semiconductor storage device according to claim 12, wherein an amount of charge accumulation in the second write step is not less than an amount of charge accumulated in the first write step so that the charge accumulated in the first and second charge accumulation portions prevents electrons from moving towards the gate electrode during the readout of the reference data from the memory cell in the sub storage region.

* * * * *